United States Patent
Mülder et al.

(10) Patent No.: US 9,131,318 B2
(45) Date of Patent: Sep. 8, 2015

(54) METHOD AND SYSTEM FOR PROVIDING HEARING ASSISTANCE TO A USER

(75) Inventors: Hans Mülder, Wünnewil (CH); Francois Marquis, Corminboeuf (CH)

(73) Assignee: Phonak AG, Stäfa (CH)

( * ) Notice: Subject to any disclaimer, the term of this patent is extended or adjusted under 35 U.S.C. 154(b) by 162 days.

(21) Appl. No.: 13/823,983

(22) PCT Filed: Sep. 15, 2010

(86) PCT No.: PCT/EP2010/063577
§ 371 (c)(1), (2), (4) Date: Apr. 4, 2013

(87) PCT Pub. No.: WO2010/133703
PCT Pub. Date: Nov. 25, 2010

(65) Prior Publication Data
US 2013/0182876 A1    Jul. 18, 2013

(51) Int. Cl.
*H04R 25/00* (2006.01)
*H03G 3/32* (2006.01)

(52) U.S. Cl.
CPC .............. *H04R 25/00* (2013.01); *H03G 3/32* (2013.01); *H04R 25/356* (2013.01); *H04R 25/554* (2013.01); *H04R 25/407* (2013.01); *H04R 25/43* (2013.01); *H04R 25/505* (2013.01); *H04R 2225/41* (2013.01); *H04R 2225/43* (2013.01); *H04R 2460/01* (2013.01)

(58) Field of Classification Search
CPC .... H04R 25/505; H04R 25/356; H04R 25/70; H04R 25/453; H04R 2225/41; H04R 2225/43; H04R 25/407; H04R 3/02; H04R 25/554; H04R 25/30; H04R 2430/03; H04R 25/43; H04R 25/552; H04R 3/00; H04R 1/1083; H04R 2460/05; H04R 25/405
USPC ......... 381/321, 72, 71.8, 71.6, 322, 320, 318, 381/317, 92, 93, 94.1, 94.2, 94.3
See application file for complete search history.

(56) References Cited

U.S. PATENT DOCUMENTS 6,895,098 B2    5/2005    Allegro et al.
(Continued)

FOREIGN PATENT DOCUMENTS

EP       1 691 574 A2    8/2006
(Continued)

*Primary Examiner* — Davetta W Goins
*Assistant Examiner* — Phylesha Dabney
(74) *Attorney, Agent, or Firm* — Roberts Mlotkowski Safran & Cole, P.C.; David S. Safran

(57) ABSTRACT

A method for providing hearing assistance to a user by capturing input audio signals; estimating a speech level of the input audio signals and an ambient noise level of the input audio signals; applying a gain model to the input audio signals to transform the input audio signals into filtered audio signals, wherein, for a each ambient noise level, the gain varies as a function of the speech level and wherein the function varies according to the ambient noise level changing the ratio of the gain at low speech levels and at high speech levels as a function of the ambient noise level; wirelessly transmitting the filtered audio signals to a receiver unit forming or being connected to a user hearing stimulator, the stimulator being worn at or in the user's ear; and stimulating the user's hearing by the stimulator according to audio signals supplied by the receiver unit.

11 Claims, 3 Drawing Sheets

(56) References Cited

U.S. PATENT DOCUMENTS

| | | |
|---|---|---|
| 6,910,013 B2 | 6/2005 | Allegro et al. |
| 7,738,665 B2 | 6/2010 | Dijkstra et al. |
| 2002/0150264 A1 | 10/2002 | Allegro et al. |
| 2006/0182295 A1 | 8/2006 | Dijkstra et al. |

FOREIGN PATENT DOCUMENTS

| | | |
|---|---|---|
| EP | 1 729 410 A1 | 12/2006 |
| EP | 1 819 195 A2 | 8/2007 |
| EP | 1 863 320 A1 | 12/2007 |
| GB | 2 327 562 A | 1/1999 |
| WO | 02/32208 A2 | 4/2002 |
| WO | 2008/138365 A1 | 11/2008 |

METHOD AND SYSTEM FOR PROVIDING HEARING ASSISTANCE TO A USER

BACKGROUND OF THE INVENTION

1. Field of the Invention

The present invention relates to a method for providing hearing assistance to a user; it also relates to a corresponding system comprising a microphone arrangement for capturing audio signals, audio signal processing means and means for stimulating the hearing of the user according to the processed audio signals.

2. Description of Related Art

One type of hearing assistance systems is represented by wireless systems, wherein the microphone arrangement is part of a transmission unit for transmitting the audio signals via a wireless audio link to a receiver unit comprising or being connected to the stimulating means. Usually in such systems the wireless audio link is a narrow band FM radio link. The benefit of such systems is that sound captured by a remote microphone at the transmission unit can be presented at a much better SNR to the user wearing the receiver unit at his ear(s).

According to one typical application of such wireless audio systems, the stimulating means is loudspeaker which is part of the receiver unit or is connected thereto. Such systems are particularly helpful in teaching environments for normal-hearing children suffering from auditory processing disorders (APD), wherein the teacher's voice is captured by the microphone of the transmission unit, and the corresponding audio signals are transmitted to and are reproduced by the receiver unit worn by the child, so that the teacher's voice can be heard by the child at an enhanced level, in particular with respect to the background noise level prevailing in the classroom. It is well known that presentation of the teacher's voice at such enhanced level supports the child in listening to the teacher.

According to another typical application of wireless audio systems the receiver unit is connected to or integrated into a hearing instrument, such as a hearing aid. The benefit of such systems is that the microphone of the hearing instrument can be supplemented or replaced by the remote microphone which produces audio signals which are transmitted wirelessly to the FM receiver and thus to the hearing instrument. In particular, FM systems have been standard equipment for children with hearing loss in educational settings for many years. Their merit lies in the fact that a microphone placed a few inches from the mouth of a person speaking receives speech at a much higher level than one placed several feet away. This increase in speech level corresponds to an increase in signal-to-noise ratio (SNR) due to the direct wireless connection to the listener's amplification system. The resulting improvements of signal level and SNR in the listener's ear are recognized as the primary benefits of FM radio systems, as hearing-impaired individuals are at a significant disadvantage when processing signals with a poor acoustical SNR.

Most FM systems in use today provide two or three different operating modes. The choices are to get the sound from: (1) the hearing instrument microphone alone, (2) the FM microphone alone, or (3) a combination of FM and hearing instrument microphones together.

Usually, most of the time, the FM system is used in mode (3), i.e., the FM plus hearing instrument combination (often labeled "FM+M" or "FM+ENV" mode). This operating mode allows the listener to perceive the speaker's voice from the remote microphone with a good SNR while the integrated hearing instrument microphone allows the listener to also hear environmental sounds. This allows the user/listener to hear and monitor his own voice, as well as voices of other people or environmental noise, as long as the loudness balance between the FM signal and the signal coming from the hearing instrument microphone is properly adjusted. The so-called "FM advantage" measures the relative loudness of signals when both the FM signal and the hearing instrument microphone are active at the same time. As defined by the ASHA (American Speech-Language-Hearing Association 2002), FM advantage compares the levels of the FM signal and the local microphone signal when the speaker and the user of an FM system are spaced by a distance of two meters. In this example, the voice of the speaker will travel approximately 30 cm to the input of the FM microphone at a level of approximately 80 dB-SPL, whereas only about 65 dB-SPL will remain of this original signal after traveling the 2 m distance to the microphone in the hearing instrument. The ASHA guidelines recommend that the FM signal should have a level 10 dB higher than the level of the hearing instrument's microphone signal at the output of the user's hearing instrument in this particular configuration of talker and listener.

When following the ASHA guidelines (or any similar recommendation), the relative gain, i.e., the ratio of the gain applied to the audio signals produced by the FM microphone and the gain applied to the audio signals produced by the hearing instrument microphone, has to be set to a fixed value in order to achieve e.g. the recommended FM advantage of 10 dB under the above-mentioned specific conditions. Accordingly,—depending on the type of hearing instrument used—the audio output of the FM receiver usually has been adjusted in such a way that the desired FM advantage is either fixed or programmable by a professional, so that during use of the system the FM advantage—and hence the gain ratio—is constant in the FM+M mode of the FM receiver.

Contemporary digital hearing aids are capable of permanently performing a classification of the present auditory scene captured by the hearing aid microphones in order to select that hearing aid operation mode which is most appropriate for the determined present auditory scene. Examples of such hearing aids including auditory scene analysis can be found in U.S. Patent Application Publication 2002/0037087, U.S. Patent Application Publication 2002/0090098, International Patent Application Publication WO 02/032208 and U.S. Patent Application Publication US 2002/0150264.

European Patent Application EP 1 691 574 A2 and corresponding U.S. Patent Application Publication 2006/0182295 relate to a wireless system, wherein the transmission unit comprises two spaced-apart microphones, a beam former and a classification unit for controlling the gain applied in the receiver unit to the transmitted audio signals according to the presently prevailing auditory scene. The classification unit generates control commands which are transmitted to the receiver unit via a common link together with the audio signals. The receiver unit may be part of or connected to a hearing instrument. The classification unit comprises a voice energy estimator and a surrounding noise level estimator in order to decide whether there is a voice close to the microphones or not, with the gain to be applied in the receiver unit being set accordingly. The voice energy estimator uses the output signal of the beam former for determining the total energy contained in the voice spectrum.

A similar system is known from European Patent Application EP 1 819 195 A2 and corresponding U.S. Pat. No. 7,738,665, wherein the receiver unit comprises a loudspeaker rather than being part of or connected to a hearing instrument. The gain applied in the receiver unit is set according to the present auditory scene as detected by a classification unit located in the transmission unit.

In all of such wireless systems, irrespective of whether the gain applied in the receiver unit is constant or variable, the transmission unit includes a gain model according to which the gain applied to the audio signals supplied by the microphones of the transmission unit prior to being transmitted to the receiver unit is controlled in a manner such as to avoid too high sound levels at the loudspeaker, i.e., the gain is reduced at high sound input levels ("compression"). Usually the gain model applied in the transmission unit is fixed and includes at least a linear range of the level of the input audio signals in which the gain is constant and a compressive range of the level of the input audio signals in which the gain decreases from the constant gain value of the linear range with increasing level of the input audio signals, wherein the boundary between the linear range and the compressive range is formed by a so-called knee point; in other words, the gain is constant at low input levels and it is decreasing with a certain slope at higher input levels. A typical value of the knee point is about 73 dB SPL (Sound Pressure Level) of the input signal. There are also systems including a dynamic gain model rather than a fixed gain model, wherein ambient noise may cause the system to increase the overall gain, while leaving the position of the knee point constant, which improves the signal to noise ratio in the FM+M mode in the hearing instrument. While such a dynamic gain model improves signal to noise ratio in noisy surroundings, it does not offer a solution for soft speech input levels in fairly quiet conditions.

In general, wireless microphones may have variable distances to the mouth of the speaker (unless the microphone is a boom microphone). At large distances and/or in case of soft voices the speech level may be below the knee point level of the gain model of the transmission unit. In this case, amplification of these signals would not be as high as desirable (since the position of the slope of the compressive range is always the same, a relatively too high knee point corresponds to a relatively too low amplification at low input levels). Hence, especially in quiet conditions, soft voices or voices at a larger distance from the microphone may become too soft, or when the distance to the mouth varies the sound level may vary accordingly, resulting in an uneven sound image.

SUMMARY OF THE INVENTION

It is an object of the invention to provide for a method and a system for providing hearing assistance to a user by using a wireless microphone, wherein the user comfort and benefit should be enhanced.

According to the invention, this object is achieved by a method and a system as described herein.

The invention is beneficial in that, by applying a gain model wherein, for each ambient noise level, the gain varies as a function of the speech level and wherein the function varies according the ambient noise level in such a manner that the ratio of the gain at low speech levels and at high speech levels changes as a function of the ambient noise level, the effect of the distance of the microphone to the mouth of the speaker on the sound level in quiet conditions and at lower speech levels is reduced, whereby sound levels can be made more stable and the allowed maximal distance between the speaker and the microphone is increased. Thereby user comfort, user benefit and hence acceptance and usage of wireless microphones can be increased.

Preferably, the gain model comprises a linear range in which the gain is constant irrespective of the speech level of the input audio signals and a compressive range which is adjacent to the linear range and in which compressive range the gain decreases with a given slope from the constant gain value of the linear range with increasing speech level of the input audio signals, wherein the boundary between the linear range and the compressive range is formed by a knee point, and wherein the position of the knee point is a function of the ambient noise level while the slope of the compressive range remains fixed so that the constant gain value of the linear range varies according to the position of the knee point.

Preferably, the knee point is shifted to lower speech levels of the input audio signals with decreasing ambient noise levels, wherein the knee point is constant above a given threshold value of the ambient noise level. At low ambient noise levels, reducing the knee point to lower speech input levels corresponds to increasing the gain in the system, which will not improve the SNR at the microphone position, but will result in making the speech signal less susceptive to changes in level, which may be caused by variations in the distance between the speaker's mouth and the microphone. The higher gain will also result in a better SNR at ear level, provided the ambient noise level is low enough.

The gain applied in the receiver unit to the audio signals received from the transmission unit may be constant or it may be variable depending on the presently prevailing auditory scene. In the latter case the system may comprise a classification unit located in the transmission unit for analyzing the audio signals prior to being transmitted in order to determine a present auditory scene category from a plurality of auditory scene categories; a gain control unit located in the receiver unit for setting the gain applied to the audio signals; and means for transmitting gain control commands from the transmission unit to the gain control unit in order to set, by the gain control unit, the gain applied to the audio signals according to the present auditory scene category.

Preferred embodiments of the invention are defined in the dependent claims.

For the purposes of the present invention, the term "knee point" refers to a transition point that may be either a (very short) range of sharp transition of the gain or a (more extended) range of gradual transition of the gain, i.e., a smoother transition of the gain between the linear range and the compressive range.

These and further objects, features and advantages of the present invention will become apparent from the following description when taken in connection with the accompanying drawings which, for purposes of illustration only, show several embodiments in accordance with the present invention.

DETAILED DESCRIPTION OF THE INVENTION

Figure 1:
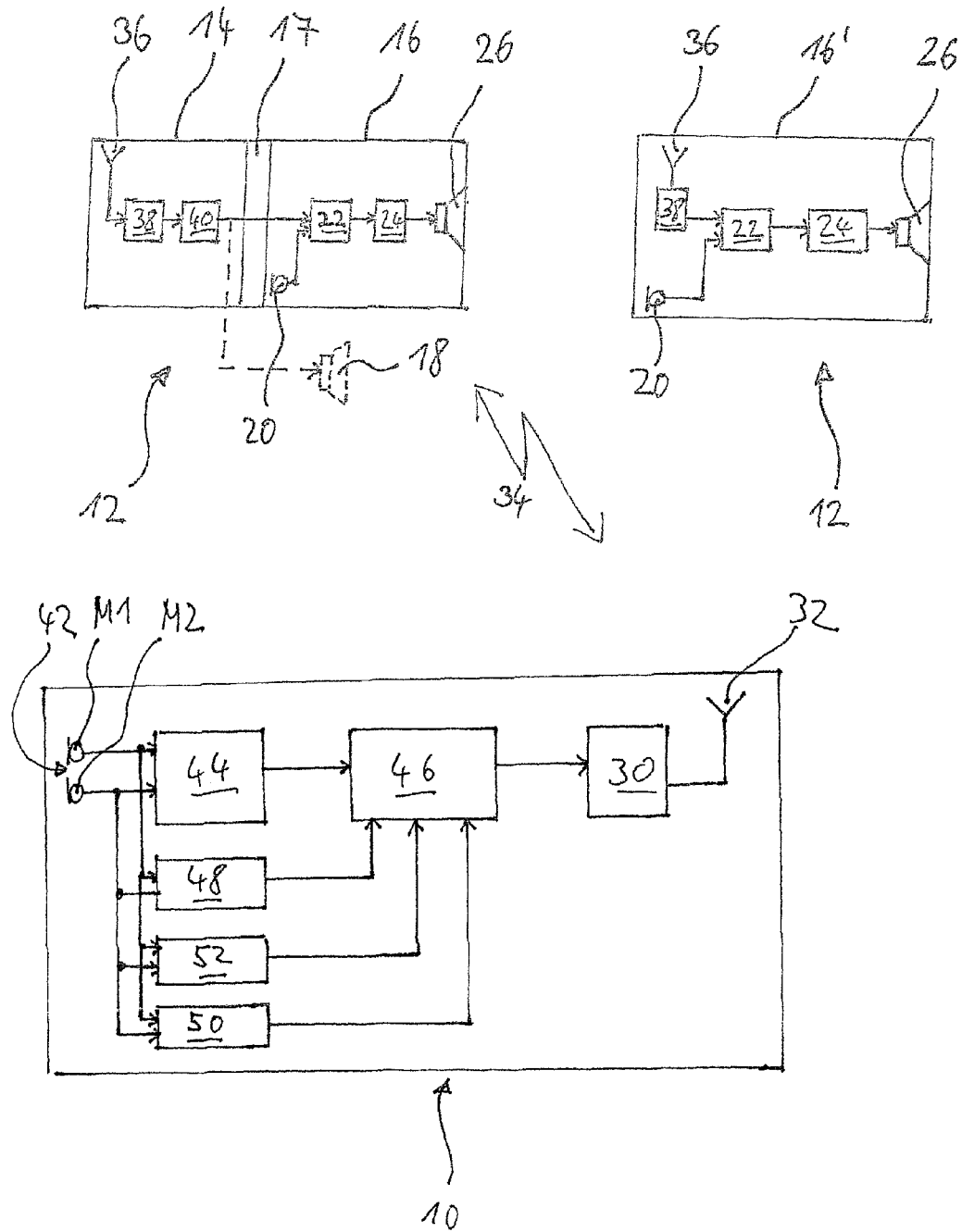
FIG. 1 is a block diagram of an example of a hearing assistance system according to the invention.

FIG. 1 shows a block diagram of an example of a wireless hearing assistance system comprising a transmission unit 10 and at least one ear unit 12 which is to be worn at or in one of the user's ears (an ear unit 12 may be provided only for one of the two ears of the user, or an ear unit 12 may be provided for each of the ears). According to FIG. 1 the ear unit 12 comprises a receiver unit 14, which may supply its output signal to a hearing instrument 16 which is mechanically and electrically connected to the receiver unit 14, for example, via a standardized interface 17 (such as a so-called "audio shoe"), or, according to a variant, to a loudspeaker 18, which is worn at least in part in the user's ear canal (for example, the loudspeaker itself may be located in the ear canal or a sound tube may extend from the loudspeaker located at the ear into the ear canal).

The hearing instrument 16 usually will be a hearing aid, such as of the BTE (Behind The Ear)-type, the ITE (In The Ear)-type or the CIC (Completely In the Canal)-type. Typically, the hearing instrument 16 comprises one or more microphones 20, a central unit 22 for performing audio signal processing and for controlling the hearing instrument 16, a power amplifier 24 and a loudspeaker 26.

The transmission unit 10 comprises a transmitter 30 and an antenna 32 for transmitting audio signals processed in a central signal processing unit 46 via a wireless link 34 to the receiver unit 14, which comprises an antenna 36, a receiver 38 and a signal processing unit 40 for receiving the audio signals transmitted via the link 34 in order to supply them to the hearing instrument 16 or the speaker 18. The wireless audio link 34 preferably is an FM (frequency modulation) link, but it could also be a different wireless link, like a digital radio link.

Rather than consisting of a receiver unit 14 connected to a hearing instrument 16 the ear unit 12, as an alternative, may comprise a hearing instrument 16' into which the functionality of the receiver unit 14, i.e., the antenna 36 and the receiver 38, is integrated. Such an alternative is also schematically shown in FIG. 1.

The transmission unit 10 comprises a microphone arrangement 42, which usually comprises at least two spaced-apart microphones M1 and M2, a beam-former 44, an audio signal processing unit 46, an ambient noise estimation unit 48 and an input speech level estimation unit 52.

The microphone arrangement 42 is provided for capturing audio signals from ambient sound, usually the voice of a person, such as a teacher, using the transmission unit 10, which audio signals are supplied to the beam former 44, wherein an acoustic beam forming algorithm is applied to the input audio signals. The output signal of the beam-former 44 is supplied to the audio signal processing unit 46. The input audio signals of at least one of the microphones M1, M2 of the microphone arrangement 42 are also supplied to the ambient noise estimation unit 48, which supplies a corresponding output signal to the audio signal processing unit 46 in order to control the audio signal processing according to the ambient noise level, and to the input speech level estimation unit 52, which estimates the input speech level of the audio signals captured by the microphone arrangement 42 in order to supply this parameter to the gain model implemented in the audio signal processing unit 46. Preferably, for estimating the ambient noise level in the ambient noise estimation unit 48, the ambient noise level is averaged over 5 to 15 seconds.

The transmission unit 10 is designed as a portable unit which may serve several purposes: it may be worn around a person's neck, usually a person speaking to the user of the ear unit 10, such as the teacher in a classroom teaching hearing-impaired persons, or a guide in a museum, etc.; it may be placed stationary on a table, for example, during a conference meeting; it may be held in the hand of the user of the ear unit 12; or it may be worn at the body of the user of the ear unit 12.

The audio signal processing unit 46 includes a gain model, and usually other elements, such as noise cancelling algorithms and/or an equalizer, i.e., a frequency-dependent gain control.

Figure 2:
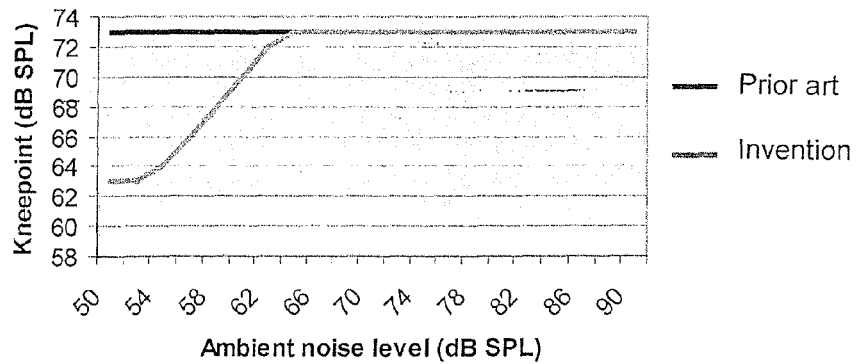
FIG. 2 is a diagram which shows an example of the knee point level of the gain model used in the transmission unit of the system of FIG. 1 as a function of the ambient noise level.
Figure 3:
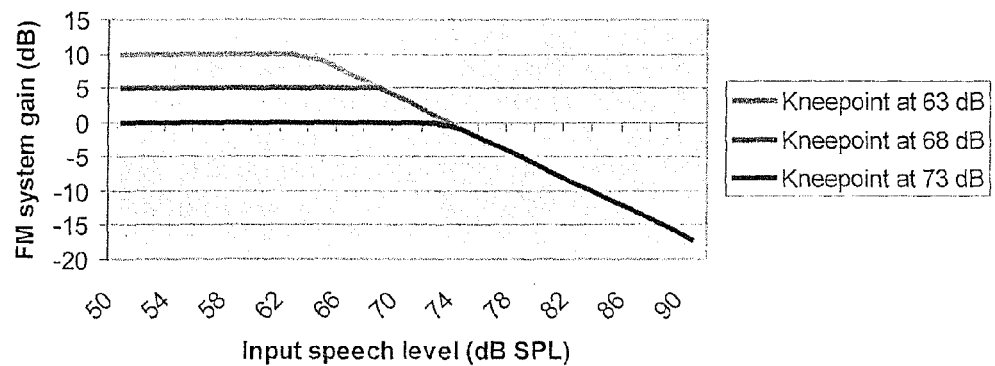
FIG. 3 is a diagram which shows an example of the gain applied in the gain model of the transmission unit of the system as a function of the input speech level for three different knee point levels.

An example of the gain model implemented in the audio signal processing unit 46 is shown in FIG. 3, according to which the gain model comprises a linear range at levels of the input speech signal which are below a knee point level $K_n$, which depends on the presently estimated ambient noise level, for example, in the manner shown in FIG. 2, and a compressive range at levels of the input speech signal above the knee point. In the linear range the gain is constant, i.e., it does not depend on the input speech level, whereas in the compressive range the gain decreases from the constant gain value of the linear range with a fixed slope with increasing input speech levels (in the double-logarithmic representation of FIG. 3 the decrease in the compressive range is linear). In FIG. 3, the gain curve is shown for three different values (levels) of the knee point, namely at 63, 68 and 73 dB, respectively. Due to the fixed slope of the compressive range, the constant gain value of the linear range increases when the level of the knee point decreases.

As it is known in the art, at very low input speech levels the gain may be progressively reduced from the constant value of the linear range with decreasing input speech levels ("soft squelch" or "expansion") in order to avoid transmission of noise signals at very low speech levels (this optional feature is not shown in FIGS. 2 to 6).

FIG. 2 shows an example of how the knee point level may vary as a function of the ambient noise level, wherein the knee point level is constant, for example, at 73 dB SPL, for ambient noise levels above 65 dB SPL, while it decreases with decreasing ambient noise level to 63 dB at ambient noise levels below 53 dB. In addition, for comparison FIG. 2 also shows the constant, i.e., ambient noise level independent, knee point level of devices of the prior art, wherein in the example the knee point level is constant at 73 dB.

Figure 4:
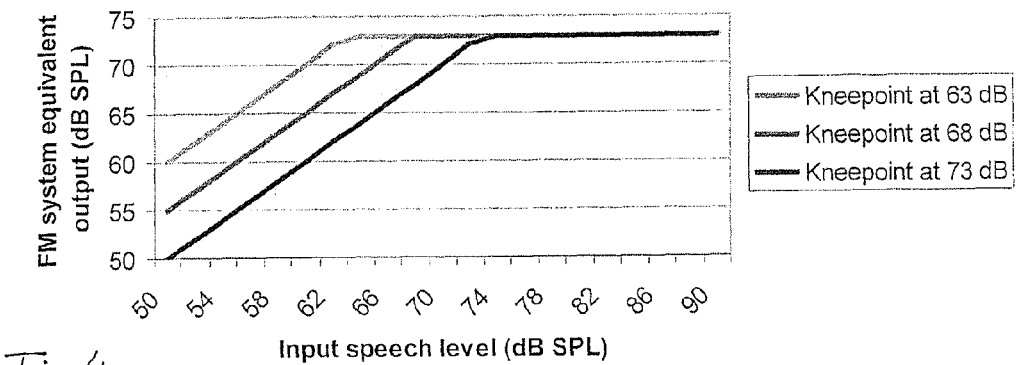
FIG. 4 is a diagram which shows an example of the output level of the system as a function of the input speech level for three different knee point levels.

FIG. 4 shows the corresponding FM system equivalent output as a function of the input speech level for the three different knee point levels of FIG. 3, where it can be seen that shifting the knee point to lower input speech levels causes the lower input speech levels to be mapped at higher output levels.

The SNR at ear level is determined by the noise and speech levels at the microphone arrangement 42 and at the hearing instrument microphone 20, by the gain applied by the FM system and by the distance between the speaking person and the listening person. At least for relatively low sound levels of the speech at the microphone arrangement 42 of the transmission unit 10 it can be assumed that the speech level directly arriving at the hearing aid microphone 20 has no influence on the experienced SNR, the more as the distance between the speaking person and the hearing aid microphone 20 usually will be relatively large.

Figure 5:
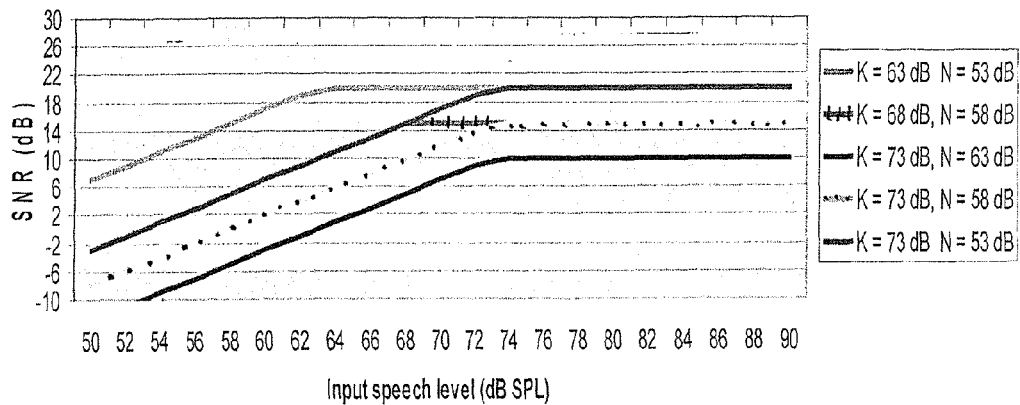
FIG. 5 is a diagram which shows an example of the SNR at ear level as a function of the input speech level for different values of the ambient noise level and for different knee point levels of the gain model.

The SNR at ear level is shown in FIG. 5, where K stands for the knee point level and N stands for the ambient noise level. It can be seen in FIG. 5 that lowering the knee point level results in an improved SNR at low input speech levels for the same ambient noise level. It is important that lower knee point levels occur only when the ambient noise level is sufficiently low.

Figure 6:
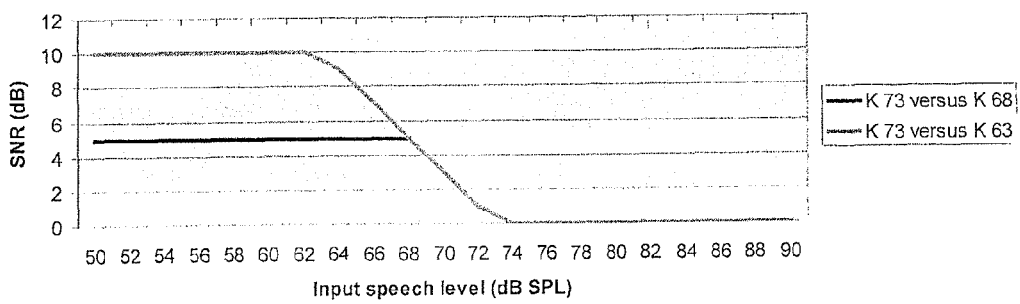
FIG. 6 is a diagram which shows an example of the improvement in SNR as a function of the input speech level, when comparing a given knee point level to two other knee point levels, respectively.

In FIG. 6, the SNR improvement by a knee point level of 73 dB versus a knee point level of 68 dB is compared to the improvement by a knee point level of 73 dB versus a knee point level of 63 dB. It can be seen from FIG. 6 that in the latter case the SNR improvement is more pronounced at low input speech levels.

Optionally, the transmission unit 10 may include a voice activity detector 50 for estimating the presence of speech close to the microphone arrangement 42, in order to adapt the audio signal processing scheme in the audio signal processing unit 46 accordingly.

In the system shown in FIG. 1, the gain applied to the audio signals received in the receiver unit 14 is constant, i.e., it does not depend on the present auditory scene. However, the system may be modified in such a manner that the gain applied to the received audio signals in the receiver unit 14 is variable depending on the present auditory scene as classified by a classifier implemented in the transmission unit 10. In such embodiments, the transmission unit 10 not only transmits the audio signals to the receiver unit, but in addition it also transmits control commands for setting the gain in the receiver unit 14 according to the auditory scene as detected by the classifier in the transmission unit 10. Examples of such variable gain devices are described in International Patent Application Publication WO 2008/138365, EP 1 691 574 A2 (and corresponding U.S. Patent Application Publication 2006/0182295), EP 1 819 195 A2 (and corresponding U.S. Pat. No. 7,738,665) and EP 1 863 320 A1.

As it is known in the art, at very low input speech levels the gain may be progressively reduced from the constant value of the linear range with decreasing input speech levels ("soft squelch" or "expansion") in order to avoid transmission of noise signals at very low speech levels (this optional feature is not shown in FIGS. 2 to 6).

While various embodiments in accordance with the present invention have been shown and described, it is understood that the invention is not limited thereto, and is susceptible to numerous changes and modifications as known to those skilled in the art. Therefore, this invention is not limited to the details shown and described herein, and includes all such changes and modifications as encompassed by the scope of the appended claims.

What is claimed is:

1. A method for providing hearing assistance to a user, comprising:
    capturing input audio signals by a microphone arrangement;
    estimating a speech level of the input audio signals and an ambient noise level of the input audio signals;
    applying a gain model to the input audio signals to transform the input audio signals into filtered audio signals, wherein, for a each ambient noise level, gain is varied as a function of the estimated speech level and wherein the function is varied according to the estimated ambient noise level in such a manner that the ratio of the gain at low speech levels and at high speech levels changing as a function of the estimated ambient noise level;
    transmitting the filtered audio signals by a transmission unit via a wireless audio link to a receiver unit comprising or connected to means for stimulating hearing of a user, the stimulating means being worn at or in a user's ear; and
    stimulating the user's hearing with the stimulating means according to the audio signals supplied by the receiver unit,
    wherein the receiver unit is connected to or integrated within a hearing aid and wherein the stimulation means is an output transducer of the hearing aid.

2. The method of claim 1, wherein the estimated ambient noise level is averaged over 5 to 15 seconds for estimating the ambient noise level.

3. The method of claim 1, wherein the microphone arrangement comprises at least two spaced apart microphones and wherein audio signals captured by the microphones are processed by an acoustic beam-former unit.

4. The method of claim 1, wherein the input audio signals are analyzed by a voice activity detector to estimate a presence of speech close to the microphone arrangement.

5. The method of claim 1, wherein audio signals are captured by at least one microphone of the hearing aid are mixed with audio signals supplied by the receiver unit.

6. The method of claim 1, wherein the stimulation means is part of or directly connected to the receiver unit.

7. A method for providing hearing assistance to a user, comprising:
    capturing input audio signals by a microphone arrangement;
    estimating a speech level of the input audio signals and an ambient noise level of the input audio signals;
    applying a gain model to the input audio signals to transform the input audio signals into filtered audio signals, wherein, for a each ambient noise level, gain is varied as a function of the estimated speech level and wherein the function is varied according to the estimated ambient noise level in such a manner that the ratio of the gain at low speech levels and at high speech levels changing as a function of the estimated ambient noise level;
    transmitting the filtered audio signals by a transmission unit via a wireless audio link to a receiver unit comprising or connected to means for stimulating hearing of a user, the stimulating means being worn at or in a user's ear; and
    stimulating the user's hearing with the stimulating means according to the audio signals supplied by the receiver unit,
    wherein the gain model comprises a linear range in which the gain is constant irrespective of the estimated speech level of the input audio signals and a compressive range which is adjacent to the linear range and in which compressive range the gain decreases with a given slope from a constant gain value of the linear range with increasing speech level of the input audio signals, wherein a boundary between the linear range and the compressive range is formed by a knee point, and wherein a position of the knee point is a function of the estimated ambient noise level while the slope of the compressive range remains fixed so that the constant gain value of the linear range varies according to the position of the knee point.

8. The method of claim 7, wherein the position of the knee point is shifted to lower estimated speech levels of the input audio signals with decreasing estimated ambient noise level.

9. The method of claim 8, wherein the position of the knee point is constant above a threshold value of the estimated ambient noise level.

10. A method for providing hearing assistance to a user, comprising:
    capturing input audio signals by a microphone arrangement;

estimating a speech level of the input audio signals and an ambient noise level of the input audio signals;

applying a gain model to the input audio signals to transform the input audio signals into filtered audio signals, wherein, for a each ambient noise level, gain is varied as a function of the estimated speech level and wherein the function is varied according to the estimated ambient noise level in such a manner that the ratio of the gain at low speech levels and at high speech levels changing as a function of the estimated ambient noise level;

transmitting the filtered audio signals by a transmission unit via a wireless audio link to a receiver unit comprising or connected to means for stimulating hearing of a user, the stimulating means being worn at or in a user's ear; and stimulating the user's hearing with the stimulating means according to the audio signals supplied by the receiver unit, wherein the audio link is one of an FM radio link and a wireless digital radio link.

11. A system for providing hearing assistance to a user, comprising:

a microphone arrangement for capturing input audio signals;

means for estimating a speech level of the input audio signals and means for estimating an ambient noise level of the input audio signals;

an audio signal processing unit for applying a gain model to the input audio signals in order to transform the input audio signals into filtered audio signals in which, for a each estimated ambient noise level, gain varies as a function of the estimated speech level and in which the function varies according the estimated ambient noise level in such a manner that a ratio of the gain at low estimated speech levels and at high estimated speech levels changes as a function of the estimated ambient noise level;

a receiver unit comprising or being connected to means for stimulating hearing of a user, the means for stimulating being wearable at or in a user's ear;

a wireless audio link;

a transmission unit for transmitting the filtered audio signals via the wireless audio link to the receiver unit, the transmission unit comprising the estimating means and the audio signal processing unit;

wherein the receiver unit is adapted for supplying the received audio signals to the means for stimulating wherein the gain model comprises a linear range in which the gain is constant irrespective of the estimated level of the speech input audio signals and a compressive range, which is adjacent to the linear range and in which compressive range the gain decreases with a given slope from a constant gain value of the linear range with increasing estimated speech level of the input audio signals, wherein a boundary between the linear range and the compressive range is formed by a knee point, and wherein a position of the knee point is variable as a function of the estimated ambient noise level while the slope of the compressive range remains fixed so that the constant gain value of the linear range varies according to the position of the knee point.

* * * * *